United States Patent [19]

Takase

[11] Patent Number: 4,661,776
[45] Date of Patent: Apr. 28, 1987

[54] NUCLEAR MAGNETIC RESONANCE DIAGNOSTIC APPARATUS

[75] Inventor: Hidetomo Takase, Tokyo, Japan

[73] Assignee: Tokyo Shibaura Denki Kabushiki Kaisha, Kawasaki, Japan

[21] Appl. No.: 843,933

[22] Filed: Mar. 24, 1986

Related U.S. Application Data

[63] Continuation of Ser. No. 536,509, Sep. 28, 1983, abandoned.

[30] Foreign Application Priority Data

Sep. 29, 1982 [JP] Japan ............................. 57-170379

[51] Int. Cl.$^4$ ........................................... G01R 33/20
[52] U.S. Cl. .................................. 324/309; 324/307
[58] Field of Search ............... 324/300, 307, 309, 318, 324/322

[56] References Cited

U.S. PATENT DOCUMENTS

| | | | |
|---|---|---|---|
| 4,070,611 | 1/1978 | Ernst | 324/309 |
| 4,319,190 | 3/1982 | Brown | 324/309 |
| 4,431,968 | 2/1984 | Edelstein | 324/309 |
| 4,468,621 | 8/1984 | Hinshaw | 324/309 |
| 4,471,306 | 9/1984 | Edelstein | 324/311 |
| 4,480,228 | 10/1984 | Bottomley | 324/309 |

Primary Examiner—Michael J. Tokar
Attorney, Agent, or Firm—Cushman, Darby & Cushman

[57] ABSTRACT

An NMR diagnostic apparatus and method for producing a high spatial resolution image of a thick, predetermined region of an object under NMR examination. A static magnetic field is applied to the object along its longitudinal axis. A $G_z$ magnetic field gradient is applied to the object along the longitudinal axis for a first time period. This causes magnetizations of individual nuclear spins within the object to rotate at different phases depending upon the position of the nuclei within the predetermined region of the object. Radio frequency pulses are then applied along the longitudinal axis of the object, in the absence of any magnetic field gradient. The RF pulses excite the nuclei within the predetermined region. During a second time period, a magnetic field gradient $G_{xy}$ is applied to the object in a direction transverse to the longitudinal axis. Finally, NMR signals are received from the predetermined region of the object and indicate the relative density and position of the nuclei within the object. From such NMR signals, a two-dimensional projection image of the predetermined region is obtained.

4 Claims, 10 Drawing Figures

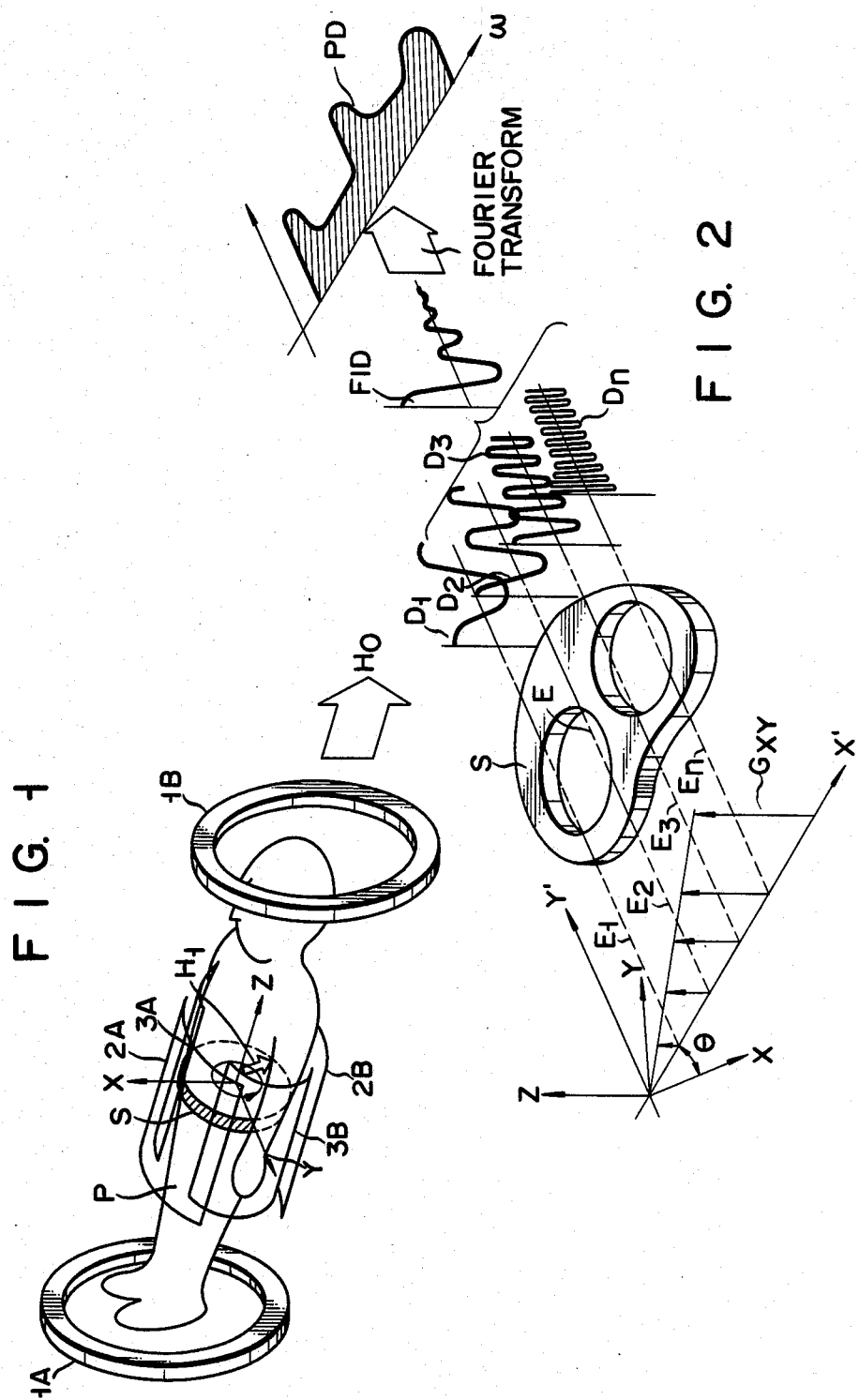

F I G. 5A
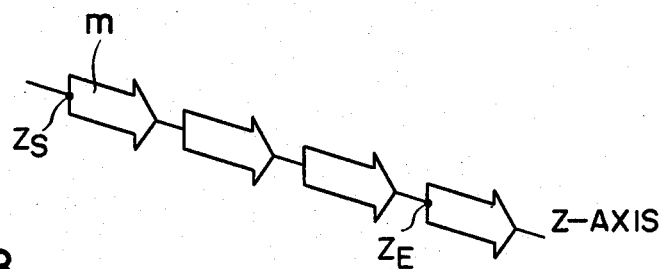
F I G. 5B
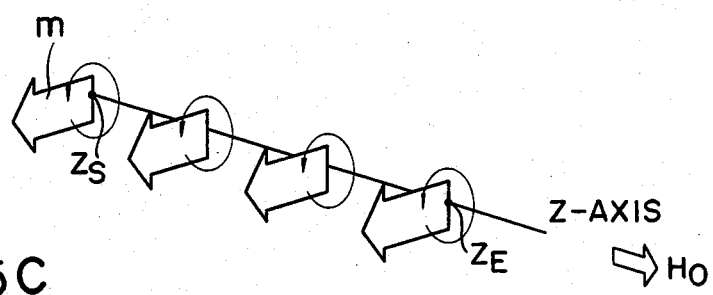
F I G. 5C
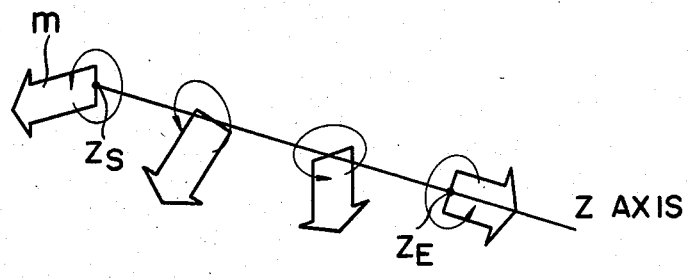

NUCLEAR MAGNETIC RESONANCE DIAGNOSTIC APPARATUS

This is a continuation of application Ser. No. 536,509, filed Sept. 28, 1983, which was abandoned upon the filing hereof.

BACKGROUND OF THE INVENTION

I. Field of the Invention

The present invention relates to a nuclear magnetic resonance diagnostic apparatus and method (referred to as "NMR" hereinafter) for producing a two-dimensional projection image (referred to as a "scanogram" hereinafter) of a specific nuclear spin density distribution present in an object to be examined, e.g., a patient (referred to as a "patient"), in two directions by using the NMR phenomenon.

II. Description of the Prior Art

To obtain a scanogram by means of a conventional diagnostic apparatus utilizing the NMR phenomenon, one-dimensional projection data (referred to as a "PD" hereinafter) has been used.

As is known, the "scanogram" is utilized to determine which portion of an object (such as a diseased portion) the NMR images are taken from, before a plurality of the formal NMR images are taken for diagnostic purpose.

To obtain the PD, a uniform static magnetic field $H_0$ is applied to the patient along the z-axis, and a linear gradient magnetic field (referred to as a "linear gradient field") $G_z$ generated by a pair of gradient magnetic field generating coils 1A and 1B is superimposed to the static field $H_0$ along the z-axis, as shown in FIG. 1. A specific nucleus with regard to the static field $H_0$ resonates at an angular frequency $\omega_0$ given by the following formula:

$$\omega_0 = \gamma H_0 \qquad (1)$$

where $\gamma$ is a gyromagnetic ratio and is inherently determined by the individual specific nucleus. A rotating magnetic field, or an RF pulse $H_1$ having an angular frequency $\omega_0$ to resonate only the specific nucleus, is applied via a pair of transmitter coils 2A and 2B to the shown x-y plane of the patient P defined by the above-mentioned linear gradient field $G_z$, so that the NMR phenomenon occurs only in a cross-sectionally sliced portion S (referred to a "sliced portion") of the patient, which is taken for tomographic images. This sliced portion is regard as a flat portion, but it has a thickness. The NMR phenomenon is observed by an NMR signal, e.g., a free induction decay signal (referred to as a "FID signal") through a pair of receiver coils or probe head coils 3A and 3B. This FID signal is subjected to Fourier transformation, thereby obtaining a signal spectrum with respect to a rotating frequency of the nuclear spin of the specific nucleus. To obtain a projection image in a predetermined direction in the x-y plane of the sliced portion S, the sliced portion S is excited to cause the NMR phenomenon. Thereafter, a magnetic field $G_{xy}$ having a linear gradient along the X'-axis is superimposed to the static field $H_0$. This X'-axis is obtained by rotating the x-axis toward the y-axis through a given angle $\theta$. Equivalent field lines E in the sliced portion S of the patient P then become straight, and the rotating frequency of the nuclear spin of the specific nucleus on the equivalent field line E is expressed by the above equation (1) (see FIG. 2). For illustrative convenience, it is assumed that signals $D_1$ to $D_n$, similar to the FID signal, are produced from the equivalent field lines $E_1$ to $E_n$, respectively. The amplitudes of the signals $D_1$ to $D_n$ are proportional to the nuclear spin densities on the equivalent field lines $E_1$ to $E_n$, respectively extending through the sliced portions. In practice, however, the obtained FID signal is a sum of those signals $D_1$ to $D_n$ or is a composite FID signal. When the composite FID signal is processed by Fourier transformation, a PD (one-dimensional projection image) is obtained by a projection of the sliced portion S along the x'-axis.

When successive PDs are obtained by continuously changing and projecting the sliced portion, a scanogram SG is obtained as shown in FIG. 3.

To realize a satisfactory spatial resolution of the scanogram SG in the longitudinal direction of the patient P, many projections must be performed under the conditions that the slice thickness must be very thin and any space between the adjacent sliced portions must be eliminated. However, in general, a shift of the sliced portion is performed by mechanically moving the patient P in the longitudinal direction Z. As a result, a mechanism of a patient moving device (not shown) becomes complex. Furthermore, the level of the FID signal is proportional to the quantity of excited magnetization. The thinner, the slice becomes, the smaller, the FID signal becomes. As a result, a signal to noise ratio (referred to as an "S/N" ratio hereinafter) is significantly lowered. To improve the S/N ratio, the same sliced portion must be repeatedly examined from the same projection direction. As a result, projection time is prolonged, through a PD for only one sliced portion is obtained.

OBJECT OF THE INVENTION

It is a primary object of the present invention to provide a diagnostic apparatus and method which utilize the nuclear magnetic resonance phenomenon, wherein, no relative mechanical transportation between the object to be examined and the NMR diagnostic apparatus is required to obtain a scanogram of an object to be examined. It is a secondary object of the present invention to provide NMR diagnostic apparatus and method in which only a short projection time is required to obtain a scanogram image having a high spatial resolution.

SUMMARY OF THE INVENTION

These objects may be accomplished by providing a diagnostic apparatus and method utilizing nuclear magnetic resonance techniques in which: the 90° pulse is applied in the absence of any magnetic field gradient. First, a static magnetic field is applied to the object along the longitudinal axis of the object. A first magnetic field gradient $G_z$ is applied for a predetermined period of time along the longitudinal axis of the object. This field $G_z$ causes magnetizations of individual nuclear spins polarized by the static magnetic field to rotate in different phases depending the location of the given nuclei inside the object since the first gradient field strength varies as a function of position within a predetermined region of the object. Next, a 90° RF pulse is applied to the object in the absence of any magnetic field gradients and along the longitudinal axis of the object. During a second predetermined period of time, a second magnetic field gradient $G_{xy}$ is applied to the object along a direction transverse to the longitudinal axis to vary the magnetic field within the object.

The nuclear magnetic resonance signals are then read out from the object and provide information regarding the relative density and position of the nuclei disposed with the predetermined region. Finally, a two-dimensional projection image of the relative density and position of the nuclei within the predetermined region may be constructed.

BRIEF DESCRIPTION OF THE DRAWINGS

The present invention may be best understood with reference to the accompanying drawings in which:

FIG. 1 is a schematical diagram of a fundamental construction of an NMR diagnostic apparatus;

FIG. 2 schematically shows a fundamental diagram for explaining how to obtain projection data by means of the NMR phenomenon;

FIGS. 5A to 5C are schematic diagrams for explaining the moment of magnetization;

DETAILED DESCRIPTION OF THE PREFERRED EMBODIMENTS

When the spin density distribution of a specific nucleus present in a patient P is given as f(x,y,z), and an RF field (induced by a 90° pulse $H_1$) is applied through transmitter coils 2A and 2B, the motion of the net magnetization M in a region V excited by the 90° pulse, for which a scanogram is taken, is expressed by the following equation if the relaxation times are negligible. It should be noted that the net magnetization M of a sample (e.g., the sliced portion) results from summing the individual magnetization vectors (referred to as "net magnetization M" hereinafter).

$$M(x,y,z,t) = f(x,y,z) \exp(j\omega t) \quad (2)$$

where M is a complex number representing the net magnetization, and f(x,y,z) which is generally expressed as a vector but is herein represented by a complex number for the sake of simplicity, is a real number representing the nuclear spin density, j is the imaginary unit ($=\sqrt{-1}$), $\omega$ is the angular frequency of the rotating magnetization which is obtained by equation (1) above, and t is time which is represented by a real number.

Figure 3:
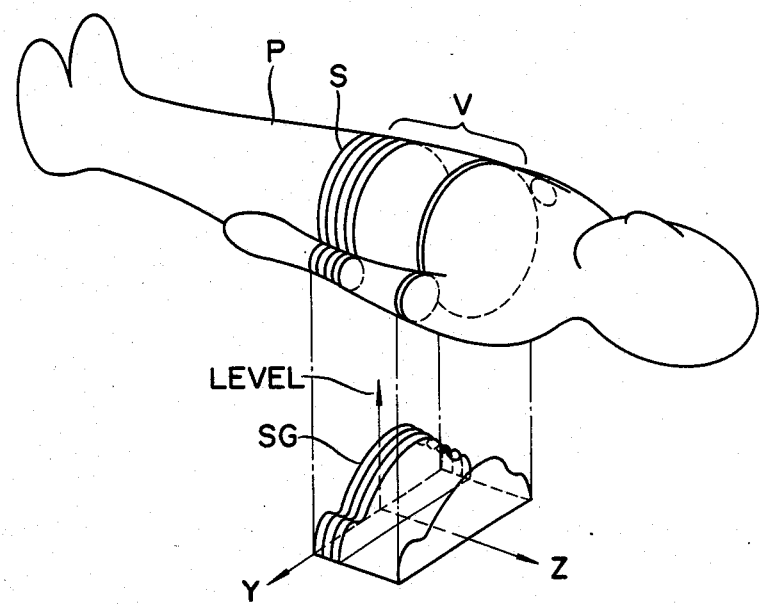
FIG. 3 schematically shows a fundamental diagram for explaining how to obtain a scanogram by utilizing a one-dimensional projection image.
Figure 4:
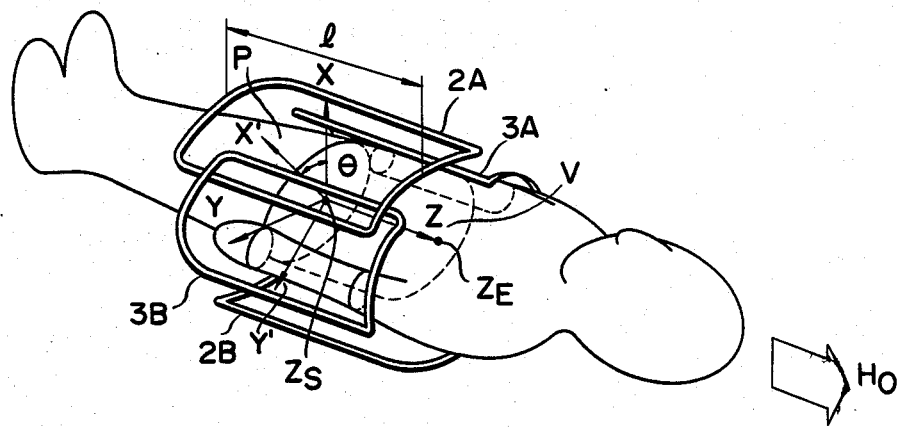
FIG. 4 illustrates a basic configuration for explaining an embodiment of the present invention.

A gradient magnetic field $G_z(t)$ is applied to the patient P along the z-axis of the steady field, so as to satisfy equation (3):

$$\gamma l \int_0^{\tau z} G_z(t)dt = \xi n \quad (3)$$

where $\gamma$ is the gyromagnetic ratio of the specific nucleus, l is the typical length of the patient P in the longitudinal direction thereof corresponding to the length of the transmitter coils 2A and 2B arranged in the longitudinal direction thereof (see FIG. 4), $\xi$ is any constant indicating an angle (radian) excluding zero, and n is a variable. When $G_z(t)$ is given as a sinusoidal curve gz sin $(\pi/\tau z)t$ for n=1, equation (3) can be satisfied by changing the coefficient gz.

Individual magnetizations m shown in FIG. 5A tend to incline along the same direction in response to the 90° pulse, as shown in FIG. 5B (the rotating field rotates at the angular frequency given by equation (2)). However, when a positive gradient field $G_z$ is applied along the z-axis of the steady field $H_0$, the magnetic strength at point $Z_E$ becomes greater than that at point $Z_S$, so that the angular frequency of the rotating field is increased. It should be noted that the point $Z_S$ indicates the starting point along the z-axis and the point $Z_E$ indicates the ending point along the z-axis. However, since the gradient field $G_z$ is applied only for time $\tau z$ (referred to FIGS. 6 and 7), when the application of the gradient field $G_z$ is interrupted, the magnetization "m" at the points $Z_S$ and $Z_E$ rotate at the same angular frequency (referred to FIG. 5B). However, each magnetization "m" has a phase difference indicated by an angle $\phi$ as follows:

$$\phi = \xi(Z/l) \quad (4)$$

wherein $\xi$ and l denote the same factors as in equation (3).

When the gradient field $G_z$ is applied along the z-axis for the given time $\tau z$, the magnetic field is warped, as shown in FIG. 5C. In this case, the motion of the individual magnetization "m" is given as follows:

$$M(x,y,z,t) = C \cdot f(x,y,z) \exp\{j+(\omega t + \phi n)\} \quad (5)$$

where M, f, j, $\omega$ and t denote the same factors as in equation (2), n denotes the same factor as in equation (3), and C is a constant of proportionality.

By using the angle $\phi$, the signal obtained along the z-axis (i.e., along the longitudinal direction of the patient P) can be separated to obtain the scanogram (two-dimensional projection image).

In the same manner as described with the conventional method, when the gradient field $G_{xy}$ is applied to the steady field $H_0$ along the x'-axis which forms the angle $\theta$ with respect to the x-axis (see FIG. 2), the FID signal is obtained as follows:

$$Fd(t,n) = K \int \int \int_{-\infty}^{\infty} f(x'\cos\theta - y'\sin\theta, x'\sin\theta + y'\cos\theta, Z)dy' \exp\{j(\omega(x')t + \phi(Z)n)\}dx'dZ \quad (6)$$

where K is a constant of proportionality.

According to equations (1) and (4), $\omega(x') = \gamma G_{xy} x'$ and $\phi(Z) = (\xi/l)Z$ are given, and equation (6) can be rewritten as follows:

$$Fd(t,n) = (Kl/\xi\gamma G_{xy}) \int \int \int_{-\infty}^{\infty} f(x'\cos\theta - y'\sin\theta, x'\sin\theta + y'\cos\theta, Z)dy' \exp\{j(\omega t + \phi n)\}d\omega d\phi \quad (6')$$

A scanogram Sg(x',Z) can be given as follows:

$$Sg(x',Z) = \int_{-\infty}^{\infty} f(x'\cos\theta - y'\sin\theta, x'\sin\theta + y'\cos\theta, Z)dy' \quad (7)$$

Equation (6') can be rewritten in accordance with equation (7) as follows:

$$Fd(t,n) = (Kl/\xi\gamma G_{xy}) \iint_{-\infty}^{\infty} Sg(x',Z) \exp\{j(\omega t + \phi n)\} \cdot d\omega d\phi \quad (8)$$

The scanogram $Sg(x',Z)$ can be obtained by two-dimensional Fourier-transform of $F(t,n)$ (equation (8)) by:

$$Sg(x',Z) = \{1/(2\pi)^2\}(\xi\gamma G_{xy}/Kl) \iint_{-\infty}^{\infty} Fd(t,n) \quad (9)$$
$$\exp\{-j(\omega t + \phi n)\}dndt$$

The FID signal is collected such that the value of $\xi$ in equation (3) is amplified to have a value sufficiently indicating a change of $Fd(t,n)$ along the nth direction where n is an integer $(-N, \ldots, -2, -1, 0, 1, 2, \ldots, N)$.

Figure 6:
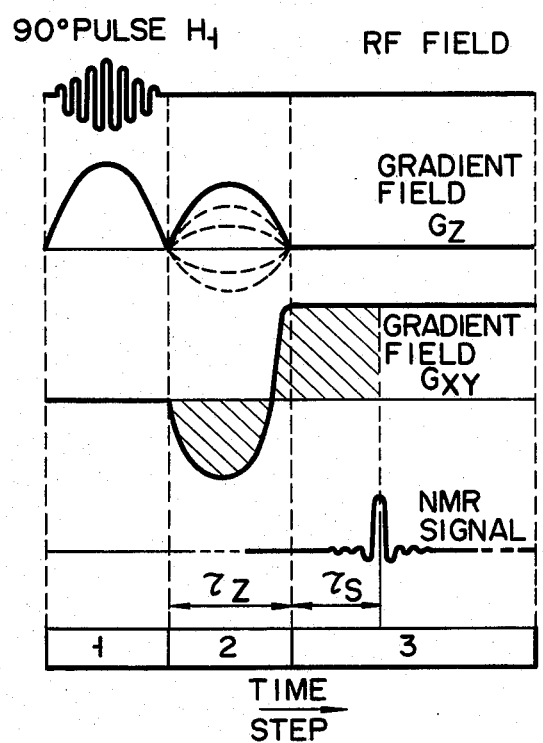
FIG. 6 is an operation waveform diagram of one preferred embodiment according to the invention.
Figure 7:
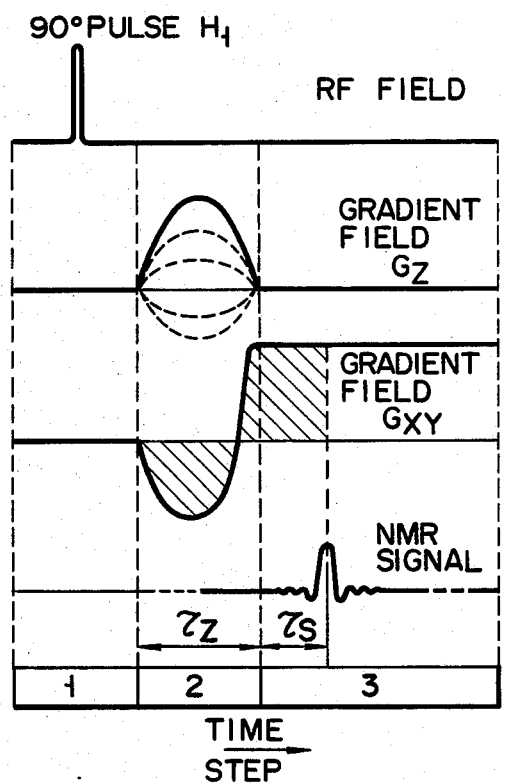
FIG. 7 is an operation waveform diagram of another preferred embodiment according to the invention.

The field application method will be summarized with reference to FIG. 6. The linear gradient field $G_z$ is applied along the z-axis in the first step and a specific nucleus in a sliced portion of the patient P is excited by a 90° pulse having a predetermined frequency component. In the second step, the linear gradient field $G_z$ satisfying equation (3) is applied to the sliced portion. That is, this linear gradient field has such a feature that the strength of magnetization changes in accordance with the value obtained by equation (3), as indicated by the dotted line. At the same time, a negative composite gradient field $G_{xy}$ is also applied to produce the NMR signal after time $\tau s$ from the end of the second step. Although this field is not directly associated with the principle of the present invention, it must be used in practice. The individual magnetization m in the sliced portion excited by the gradient field $G_z$ applied during the time period $\tau_Z$ represents "the warp phenomenon". The excitation of the slice in the first step may be alternatively performed by applying a 90° impulse, as shown in FIG. 7. As shown in FIG. 7, the 90° pulse is applied in the absence of any magnetic field gradient.

When the NMR or FID signals are collected, therefore, the entire sliced portions for which a scanogram is taken can be excited by the magnetic fields, so that a good S/N ratio can be achieved. Accordingly if the signal collection conditions are not changed in case of the present embodiments, it is not necessary to introduce any measure to improve the S/N ratio, with the result that the total projection time can be shortened as compared to that of the conventional method. Furthermore, the phase data of the magnetization is used to separate images obtained in the longitudinal direction of the patient P, so that the patient need not be moved with respect to the diagnostic apparatus, thereby obtaining a scanogram which covers a wide area of the patient.

Figure 8:
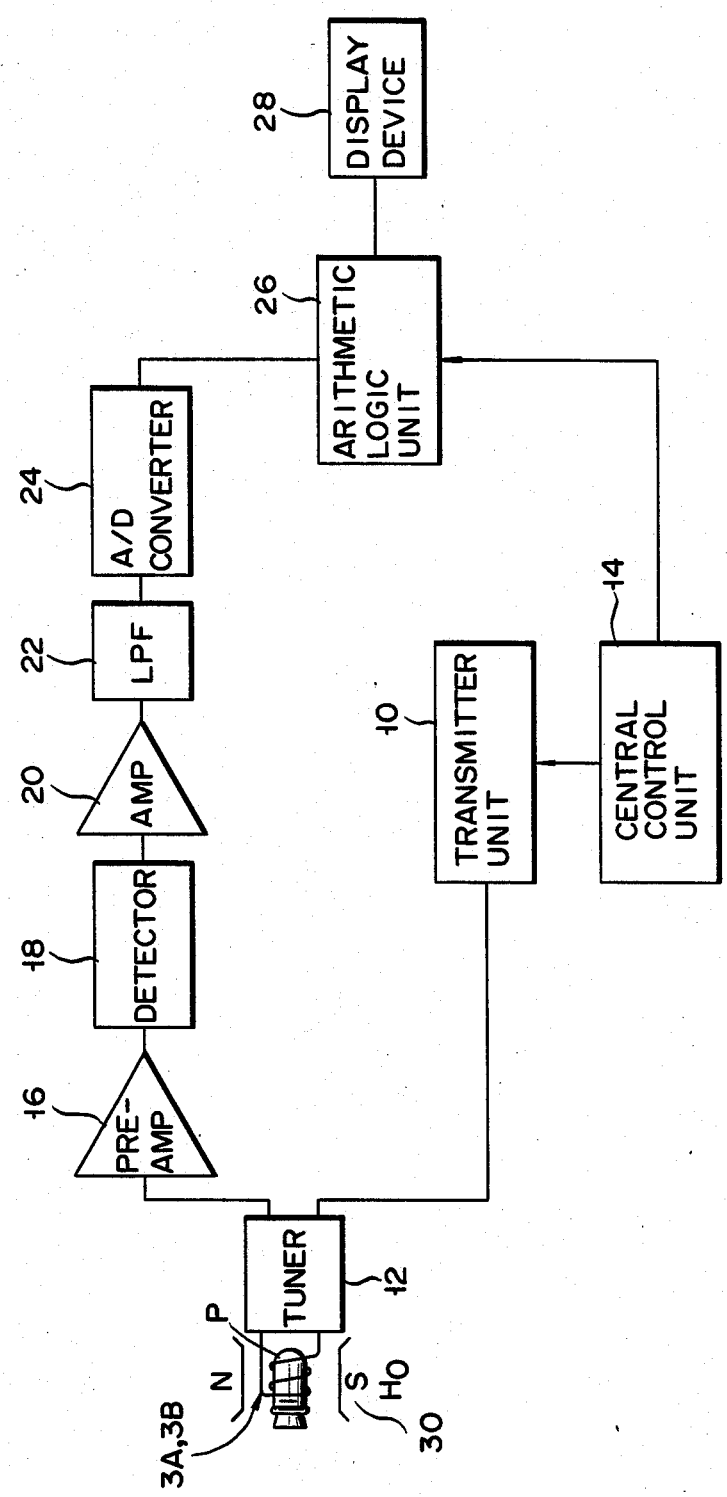
FIG. 8 schematically shows a block diagram of one preferred embodiment of an NMR diagnostic apparatus according to the invention.

FIG. 8 shows a circuit configuration of an apparatus for practicing the NMR measuring method described above.

A transmitter unit 10 will first be described. The transmitter unit 10 includes an oscillator (not shown) to generate an RF pulse H1 having a carrier wave with a center frequency of, for example, 4.258 MHz (corresponding to a magnetic field of 1,000 gauss for a hydrogen nucleus). The RF pulse is amplitude-modulated by a SINC function to obtain the RF pulse $H_1$. This RF pulse $H_1$ is applied to a tuner 12. The tuner 12 selects the RF pulse (90° pulse) having a specific frequency so as to tune the pulse width which is tuned to a specific nucleus of the patient P, and applies the pulse through the probe head coils 3A and 3B to the given sliced portion of the patient P.

On the other hand, the static field $H_0$ generated by a magnet 30 is applied to the patient P in a predetermined direction, as previously explained. Under such conditions, the gradient field $G_z$ and the composite gradient field $G_{xy}$ are applied at predetermined field strength and application timings. The application timings can be controlled by a central control unit 14.

The detection, collection and processing of the NMR signals from the patient P will now be described. After an application of the composite gradient fields $G_{xy}$, NMR signals are obtained by the excited sliced portions S of the patient P through the receiver coils 3A and 3B. The signals are amplified by a pre-amplifier 16 through the tuner 12, and amplified signals are then detected by a detector 18. Output signals from the detector 18 are again amplified by an amplifier 20 to a predetermined level. Only the signal components of these amplified signals within a required band are filtered by a low-pass filter (LPF) 22. The filtered signal components are converted by an A/D converter 24 into digital signals.

These digital signals are supplied to an arithmetic logic unit 26 which performs Fourier transformation and various types of operations as indicated by the equations previously described, thereby obtaining a scanogram. The scanogram is then monitored on a display device 28.

According to the present invention, there is provided a diagnostic apparatus and method utilizing the nuclear magnetic resonance phenomenon, wherein the spin density distribution of the specific nucleus in the patient can be imaged as a scanogram having a sufficient spatial resolution with respect to the longitudinal direction of the patient without performing a relative mechanical transportation of the patient with respect to the diagnostic apparatus in requiring a short projection time.

What is claimed is:

1. An apparatus for producing a two-dimensional projection image of an object by nuclear magnetic resonance comprising:

means for applying a static magnetic field to said object along a longitudinal axis thereof;

means for applying a first magnetic field gradient to said object for a first predetermined time period along said longitudinal axis to cause magnetizations of individual nuclear spins polarized by said static magnetic field in said object to rotate in respective different phases responsive to the field strength of said first gradient, rotation of said nuclear spins varying as a function of relative positions of the nuclei in a predetermined region of said object, said predetermined region extending to portions of said object within affective limits of said first magnetic field gradient;

means for applying a non-selective radio frequency pulse to said object, in the absence of said first magnetic field gradient, for nutating nuclear spins in said object to a transverse orientation, and for exciting nuclei in the entire predetermined region;

means for appying during a second predetermined time period subsequent to said first time period, a second magnetic field gradient to vary the magnetic field within said predetermined region along at least one direction transverse to said longitudinal axis;

means for receiving from said entire predetermined region nuclear magnetic resonance signals indicative of the relative density and position of nuclei disposed within said predetermined region, and;

means for constructing from said signals obtained from said entire predetermined region a two-dimensional projection image of said relative density and position.

2. An apparatus for examining an object by nuclear magnetic resonance as claimed in claim 1, further including:

a tuner coupled said means for appying radio frequency pulses and to said means for receiving so as to apply RF pulses to said predetermined region and receive said nuclear magnetic resonance signals;

an amplifier coupled via said tuner and to said means for applying radio frequency pulses and to said means for receiving, for amplifying said nuclear magnetic resonance signals;

a detector connected to said amplifier so as to detect the amplified nuclear magnetic resonance signals;

an analog/digital converter connected to said detector so as to convert the detected nuclear magnetic resonance signals to be processed; and a display device connected to said means for constructing so as to visually display the two-dimensional projection image of the predetermined region of said object.

3. An apparatus according to claim 1 further including central control means for controlling application timings of said means for applying a first magnetic field gradient, said means for applying a radio frequency pulse, and said means for applying a second magnetic field gradient.

4. A method for producing a two-dimensional projection image of an object by nuclear magnetic resonance comprising the steps of:

applying a static magnetic field to said object along a longitudinal axis thereof;

applying a first magnetic field gradient to said object for a first predetermined time period along said longitudinal axis to cause magnetizations of individual nuclear spins polarized by said static magnetic field in said object to rotate in respective different phases responsive to the field strength of said first gradient, rotation of said nuclear spins varying as a function of relative positions of the nuclei in a predetermined region of said object, said predetermined region extending to portions of said object within effective limits of said first magnetic field gradient;

applying a non-selective radio frequency pulse to said object, in the absence of said first magnetic field gradient, for nutating nuclear spins in said object to a transverse orientation, and for exciting nuclei in the entire predetermined region;

applying during a second predetermined time period subsequent to said first time period, a second magnetic field gradient to vary the magnetic field within said predetermined region along at least one direction transverse to said longitudinal axis;

receiving from said entire predetermined region nuclear magnetic resonance signals indicative of the relative density and position of nuclei disposed within said predetermined region; and constructing a two-dimensional projection image of said relative density and position from said signals obtained from said entire predetermined region.

* * * * *